(12) United States Patent  (10) Patent No.: US 6,397,090 B1
Cho  (45) Date of Patent: May 28, 2002

(54) POWER SAVING DEVICE FOR RADIO COMMUNICATION TERMINAL

(75) Inventor: Byung-Duck Cho, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/212,870

(22) Filed: Dec. 16, 1998

(30) Foreign Application Priority Data

Dec. 16, 1997 (KR) .............................................. 97-69207

(51) Int. Cl.$^7$ ................................................. H04B 1/16
(52) U.S. Cl. ....................... 455/574; 455/572; 455/127; 455/343
(58) Field of Search ............................... 455/67.1, 67.3, 455/69, 115, 127, 343, 423, 571, 572, 574

(56) References Cited

U.S. PATENT DOCUMENTS

| | | | |
|---|---|---|---|
| 3,962,553 A | 6/1976 | Linder et al. ............. 179/41 A |
| 4,323,881 A | 4/1982 | Mori ..................... 340/825.48 |
| 4,449,248 A | 5/1984 | Leslie et al. .................. 455/38 |
| 4,804,954 A | 2/1989 | Macnak et al. ........ 340/825.44 |
| 4,964,121 A | 10/1990 | Moore ..................... 370/100.1 |
| 5,054,052 A | 10/1991 | Nonami ....................... 379/57 |
| 5,056,109 A | 10/1991 | Gilhousen et al. ............. 375/1 |
| 5,144,296 A | 9/1992 | DeLuca et al. ........ 340/825.44 |
| 5,179,724 A | 1/1993 | Lindoff ......................... 455/76 |
| 5,203,020 A | 4/1993 | Sato et al. ..................... 455/68 |
| 5,230,096 A | 7/1993 | Davies et al. ............... 455/217 |
| 5,241,542 A | 8/1993 | Natarajan et al. .......... 370/95.3 |
| 5,280,650 A | 1/1994 | Sobti .......................... 455/343 |
| 5,287,544 A * | 2/1994 | Menich et al. .............. 455/422 |
| 5,301,225 A | 4/1994 | Suzuki et al. ................. 379/59 |
| 5,369,768 A | 11/1994 | Takano ........................ 395/725 |
| 5,381,133 A | 1/1995 | Erhart et al. ........... 340/825.44 |
| 5,384,564 A | 1/1995 | Wycoff et al. ......... 340/825.44 |
| 5,390,357 A | 2/1995 | Nobusawa et al. ......... 455/134 |

(List continued on next page.)

Primary Examiner—Nay Maung
Assistant Examiner—Lewis G. West
(74) Attorney, Agent, or Firm—Dilworth & Barrese, LLP

(57) ABSTRACT

A power saving device for a radio communication terminal reduces current consumption by changing the number of power amplifying stages. A power amplifier in the radio communication terminal includes a first amplifier for high power and a second amplifier for low power. A signal path selector switches an input signal to an input node of the first or second amplifier in response to a switching control signal. An output path selector selects one of output signals from the first and second amplifiers in response to the switching control signal. An RSSI detector detects signal strength of a signal received from a base station. A controller generates the switching control signal of a first state, when the signal strength is low, to enable the signal path selector to switch the input signal to the first amplifier and enable the output path selector to select the output signal of the first amplifier, and generates the switching control signal of a second state, when the signal strength is high, to enable the signal path selector to switch the input signal to the second amplifier and enable the output path selector to select the output signal of the second amplifier. A power supply blocks a first supply voltage to the first amplifier in response to the switching control signal of the second state, and blocks a second supply voltage to the second amplifier in response to the switching control signal of the first state.

15 Claims, 4 Drawing Sheets

U.S. PATENT DOCUMENTS

| | | | |
|---|---|---|---|
| 5,392,287 A | 2/1995 | Tiedemann, Jr. et al. | 370/95.1 |
| 5,428,638 A | 6/1995 | Cioffi et al. | 375/224 |
| 5,459,457 A | 10/1995 | Sharpe | 340/825.44 |
| 5,475,374 A | 12/1995 | Moore | 340/825.22 |
| 5,493,282 A | 2/1996 | Petreye et al. | 340/825.27 |
| 5,509,015 A | 4/1996 | Tiedemann, Jr. et al. | 370/95.3 |
| 5,513,386 A | 4/1996 | Ogino et al. | 455/234.1 |
| 5,565,853 A | 10/1996 | Jun-Young | 340/636 |
| 5,566,081 A | 10/1996 | Yoshizawa | 364/492 |
| 5,570,369 A | 10/1996 | Jokinen | 370/95.3 |
| 5,606,728 A | 2/1997 | Keba et al. | 455/38.3 |
| 5,638,540 A | 6/1997 | Aldous | 395/750 |
| 5,649,315 A | 7/1997 | Eaton | 455/343 |
| 5,666,355 A | 9/1997 | Huah et al. | 370/311 |
| 5,710,981 A | 1/1998 | Kim et al. | 455/69 |
| 5,734,686 A | 3/1998 | Kuramatsu | 375/368 |
| 5,740,517 A | 4/1998 | Aoshima | 455/38.3 |
| 5,740,524 A * | 4/1998 | Pace et al. | 455/232.1 |
| 5,742,636 A | 4/1998 | Fukushi | 375/200 |
| 5,758,269 A * | 5/1998 | Wu | 455/127 |
| 5,774,813 A | 6/1998 | Jokinen | 455/574 |
| 5,797,090 A | 8/1998 | Nakamura | 455/234.1 |
| 5,799,256 A | 8/1998 | Pombo et al. | 455/574 |
| 5,831,479 A * | 11/1998 | Leffel et al. | 330/124 |
| 5,862,460 A * | 1/1999 | Rich | 455/115 |
| 5,956,638 A * | 9/1999 | Chang et al. | 455/423 |
| 5,999,829 A * | 12/1999 | Chun et al. | 455/572 |
| 6,101,373 A * | 8/2000 | Samuels | 455/115 |

\* cited by examiner

POWER SAVING DEVICE FOR RADIO COMMUNICATION TERMINAL

BACKGROUND OF THE INVENTION

1. Field of the Invention

The present invention relates to radio communication terminals, and in particular, to a power saving device for reducing current consumption during a telephone conversation.

2. Description of the Related Art

In a CDMA (Code Division Multiple Access) or PCS (Personal Communication System) terminal, an RF (Radio Frequency) power amplifier is so designed as to have a maximum output power of +28dBm in order to satisfy the IS-98 standard and the J-STD-008 standard. In addition, a transmitter of the CDMA or PCS terminal includes an automatic gain control (AGC) amplifier for controlling the power level according to the strength of a received signal or a power control command transmitted from a base station. Accordingly, the terminal should increase the transmission power in an area where a signal transmitted from the base station has a low signal strength and decrease the transmission power in an area where the signal transmitted from the base station has a high signal strength.

In the meantime, the CDMA or PCS terminal, employing QPSK (Quadrature Phase Shift Keying) modulation, requires a linear amplifier. Therefore, the AGC amplifier adopts an A-class or AB-class bias. In such a case, however, the terminal consumes a constant current regardless of the transmission power.

FIG. 1 illustrates a conventional two-stage power amplifier. As illustrated, a driver amplifier 101 primarily amplifies an input RF signal $RF_I$, and a final amplifier 103 secondarily amplifies the amplified RF signal output from the driver amplifier 101. The driver amplifier 101 and the final amplifier 103 are both provided with a fixed level control signal (or a fixed gain control signal) to control the power level. Therefore, the amplifiers 101 and 103 consume a constant idle current regardless of the strength of the signal. This results in an increase in the current consumption.

To solve this problem, there is proposed a method of providing a variable voltage to the power amplifier to control a linear region of the power amplifier, thereby reducing the current consumption.

FIG. 2 illustrates an improved two-stage power amplifier. In the drawing, a variable voltage is provided to the driver amplifier 101 and the final amplifier 103. When the transmission power is low, the variable voltage is lowered to reduce the idle current to the minimum value. In this way, it is possible to reduce the current consumption to some extent. However, each of the elements constituting the power amplifier have a different linear region. When some of the elements have a narrow linear region, it is difficult to obtain the desirable power saving effect. Furthermore, no matter how little the idle current flow may be reduced to, each stage of the power amplifier consumes the constant current. Thus, there is a limitation in the ability to reduce the current consumption. That is, even when the transmission power is low enough such that it is not necessary to drive the final amplifier, the idle current continues to flow into the final amplifier, wasting the current.

SUMMARY OF THE INVENTION

It is therefore an object of the present invention to provide a power saving device for reducing current consumption by changing the number of power amplifying stages in a radio communication terminal.

To achieve the above object, there is provided a power saving device for a radio communication terminal including a first amplifier for high power and a second amplifier for low power including a signal path selector for switching an input signal to an input node of the first or second amplifier in response to a switching control signal. An output path selector selects one of the output signals from the first and second amplifiers in response to the switching control signal. An RSSI detector detects the signal strength of a signal received from a base station. A controller analyzes the detected signal strength, and generates a switching control signal of a first state, when the signal strength is low, to enable the signal path selector to switch the input signal to the first amplifier and enable the output path selector to select the output signal of the first amplifier. The controller also generates a switching control signal of a second state, when the signal strength is high, to enable the signal path selector to switch the input signal to the second amplifier and enable the output path selector to select the output signal of the second amplifier. A power supply blocks a first supply voltage to the first amplifier in response to the switching control signal of the second state, and blocks a second supply voltage to the second amplifier in response to the switching control signal of the first state.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings.

DETAILED DESCRIPTION OF PREFERRED EMBODIMENTS

A preferred embodiment of the present invention will be described hereinbelow with reference to the accompanying drawings. In the following description, well known functions or constructions are not described in detail since they would obscure the invention in unnecessary detail.

Figure 1:
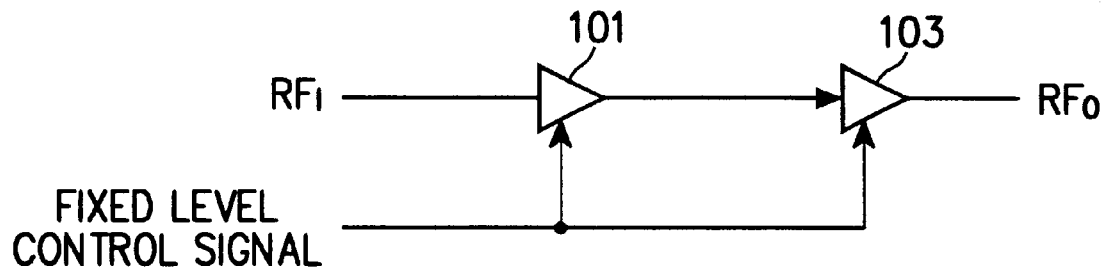
FIG. 1 is a diagram illustrating a conventional two-stage power amplifier.
Figure 2:
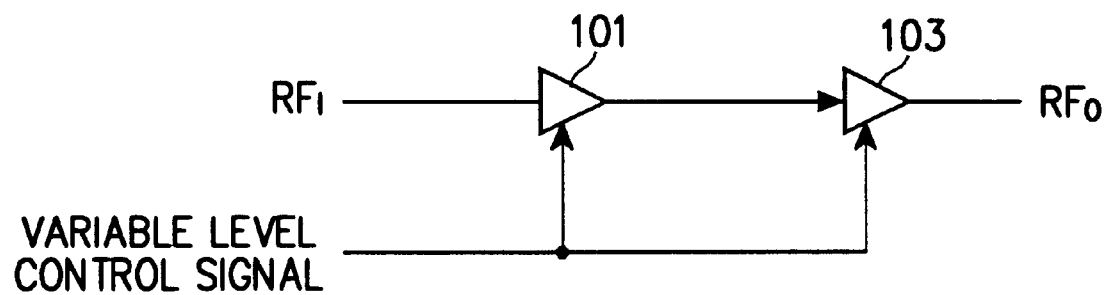
FIG. 2 is a diagram illustrating another conventional two-stage power amplifier.
Figure 3:
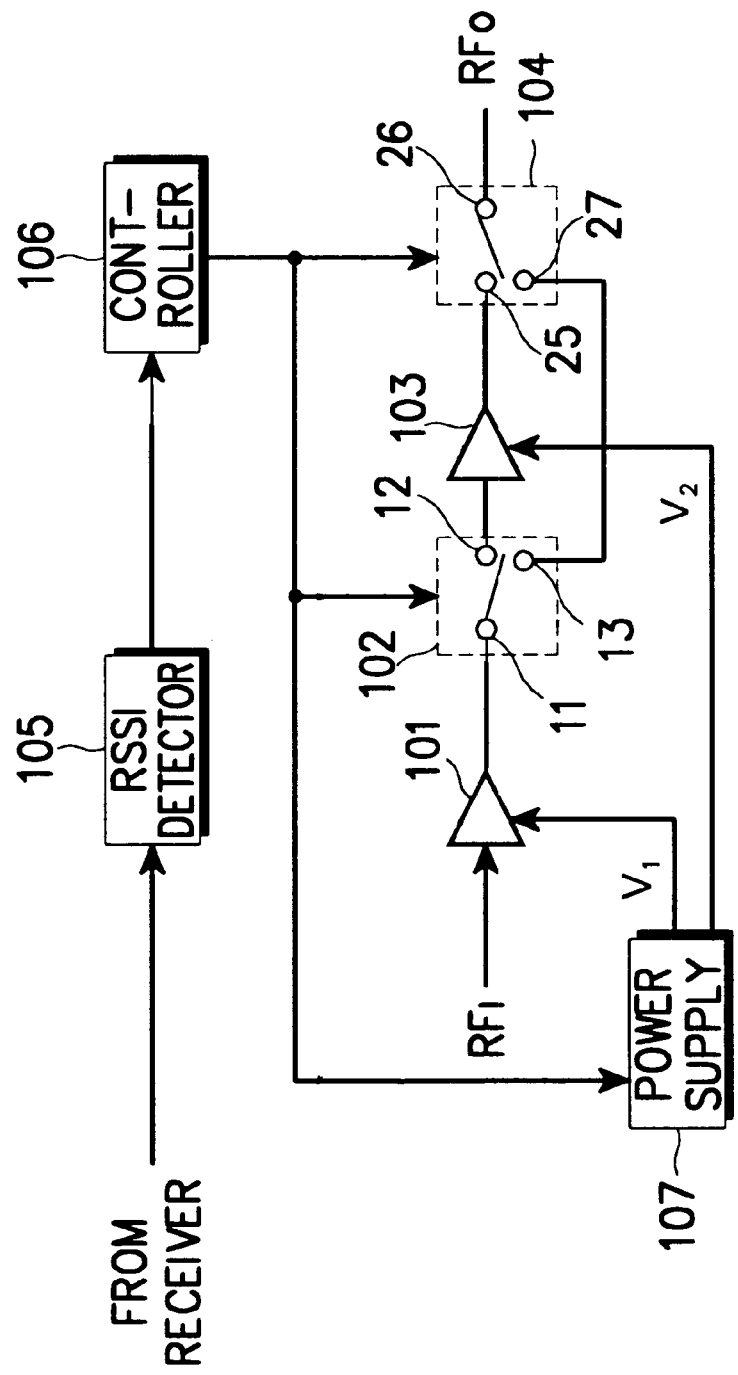
FIG. 3 is a block diagram illustrating a power saving device for a radio communication terminal according to an embodiment of the present invention.

FIG. 3 illustrates a power saving device for a radio communication terminal according to an embodiment of the present invention. As illustrated, a driver amplifier 101 primarily amplifies an input RF signal $RF_I$, and a final amplifier 103 secondarily amplifies the amplified RF signal output from the driver amplifier 101. A first switch 102, being a signal path selector, has a common node 11 connected to an output of the driver amplifier 101, a first contact node 12 connected to an input of the final amplifier 103, and a second contact node 13 connected to a second contact node 27 of a second switch 104. The common node 11 of the first switch 102 is switched to the first or second contact node 12 or 13, respectively, in response to a switching control signal from a controller 106. The second switch 104, being an output path selector, has a common node 26 for outputting an output RF signal $RF_O$ of the power amplifier, a first contact node 25 connected to an output of the final amplifier 103, and the second contact node 27 connected to the second contact node 13 of the first switch 102. Similarly, the common node 26 of the second switch 104 is switched to the first or second contact node 25 or 27, respectively, in response to the switching control signal from the controller 106.

An RSSI (Received Signal Strength Indicator) detector 105 detects the strength (i.e., an RSSI value) of a signal received from a base station (not shown). The controller 106 analyzes the detected RSSI value and generates the switching control signal of a first or second state according to the results of the analysis. A power supply 107 provides a variable supply voltage V1 to the driver amplifier 101 and a variable supply voltage V2 to the final amplifier 103, respectively, in response to the switching control signal from the controller 106. For example, when the switching control signal is in the first state, the power supply 107 provides the supply voltage V1 to the driver amplifier 101 and the supply voltage V2 to the final amplifier 103. However, when the switching control signal is in the second state, the power supply 107 provides the supply voltage V1 to the driver amplifier 101 and blocks the supply voltage V2 to the final amplifier 103. Further, the driver amplifier 101 and the final amplifier 103 are provided with a variable voltage. Output levels of the amplifiers 101 and 103 are changed according to the variable voltage.

In operation, when the detected RSSI value indicates a low signal strength, the controller 106 generates the switching control signal of the first state. Then, the common nodes 11 and 26 of the first and second switches 102 and 104 are switched to the first contact nodes 12 and 25, respectively, in response to the switching control signal of the first state. In this case, the RF signal $RF_I$ amplified in the driver amplifier 101 is delivered to the final amplifier 103 through the first switch 102 and then is output through the second switch 104. On the contrary, when the detected RSSI value indicates a high signal strength, the controller 106 generates the switching control signal of the second state. Then, the common nodes 11 and 26 of the first and second switches 102 and 104 are switched to the second contact nodes 13 and 27, respectively, in response to the switching control signal of the second state. In this case, the RF signal RF amplified in the driver amplifier 101 is directly output through the second switch 104, without passing through the final amplifier 103.

While the exemplary embodiment includes a two-stage amplifier, it can be understood that the present invention is also applicable to a multi-stage amplifier having three or more stages. In such a case, additional signal path selectors are required.

Figure 4:
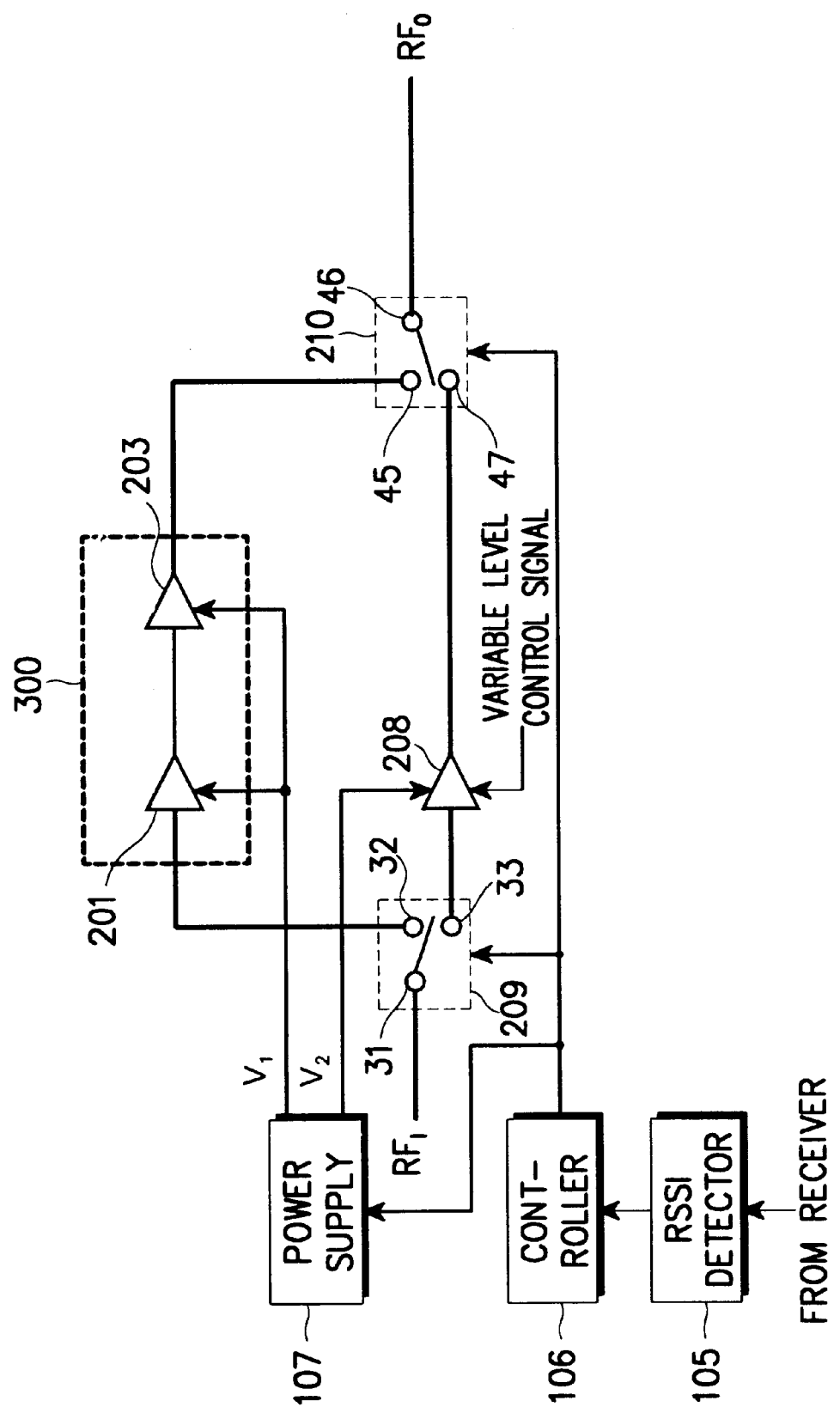
FIG. 4 is a block diagram illustrating a power saving device for a radio communication terminal according to another embodiment of the present invention.

FIG. 4 illustrates a power saving device for a radio communication terminal according to another embodiment of the present invention. As illustrated, a first driver amplifier 201 primarily amplifies the input RF signal $R_I$, and a final amplifier 203 secondarily amplifies the amplified RF signal output from the driver amplifier 201. The amplifiers 201 and 203 constitute a first power amplifier 300. A second driver amplifier 208, being a second power amplifier, amplifies the input RF signal $R_I$. Further, the first power amplifier 300 for the high transmission power and the second power amplifier 208 for the low transmission power are both provided with the variable voltage.

A first switch 209, being a signal path selector, delivers the input RF signal $R_I$, to the first driver amplifier 201 or the second driver amplifier 208 according to the switching control signal from the controller 106. The first switch 209 can be replaced with a power splitter composed of a resistor pad or a transformer. The first switch 209 has a common node 31 connected to the input RF signal $R_I$, a first contact node 32 connected to an input of the first driver amplifier 201, and a second contact node 33 connected to an input of the second driver amplifier 208.

A second switch 210, being an output path selector, outputs an RF signal from the final amplifier 203 or the second driver amplifier 208 through a common node 46 according to the switching control signal from the controller 106. The second switch 210 has a first contact node 45 connected to an output of the final amplifier 203, and a second contact node 47 connected to an output of the second driver amplifier 208.

The RSSI detector 105 detects an RSSI value of a signal received from the base station. The controller 106 analyzes the detected RSSI value and generates the switching control signal of the first or second state according to the results of the analysis. The power supply 107 provides the supply voltage V1 to the first power amplifier 300 and the supply voltage V2 to the second power amplifier 208 in response to the switching control signal from the controller 106. For example, when the switching control signal is in the first state, the power supply 107 blocks the supply voltage V2 to the second power amplifier 208 and provides the supply voltage V1 to the first power amplifier 208. However, when the switching control signal is in the second state, the power supply 107 blocks the supply voltage V1 to the first power amplifier 300 and provides the supply voltage V2 to the second power amplifier 208. Output levels of the amplifiers 201, 103 and 208 are changed according to the variable voltage.

In operation, when the detected RSSI value indicates a low signal strength, the controller 106 generates the switching control signal of the first state. Then, the common nodes 31 and 46 of the first and second switches 209 and 210 are switched to the first contact nodes 32 and 45 thereof, respectively, in response to the switching control signal of the first state. In this case, the input RF signal $R_I$ is amplified in sequence by the first driver amplifier 201 and the final amplifier 203 and then are output through the second switch 210. On the contrary, when the detected RSSI value indicates a high signal strength, the controller 106 generates the switching control signal of the second state. Then, the common nodes 31 and 46 of the first and second switches 209 and 210 are switched to the second contact nodes 33 and 47 thereof, respectively, in response to the switching control signal of the second state. In this case, the input RF signal $R_I$ is amplified by the second driver amplifier 208 and then output through the second switch 210.

Figure 5:
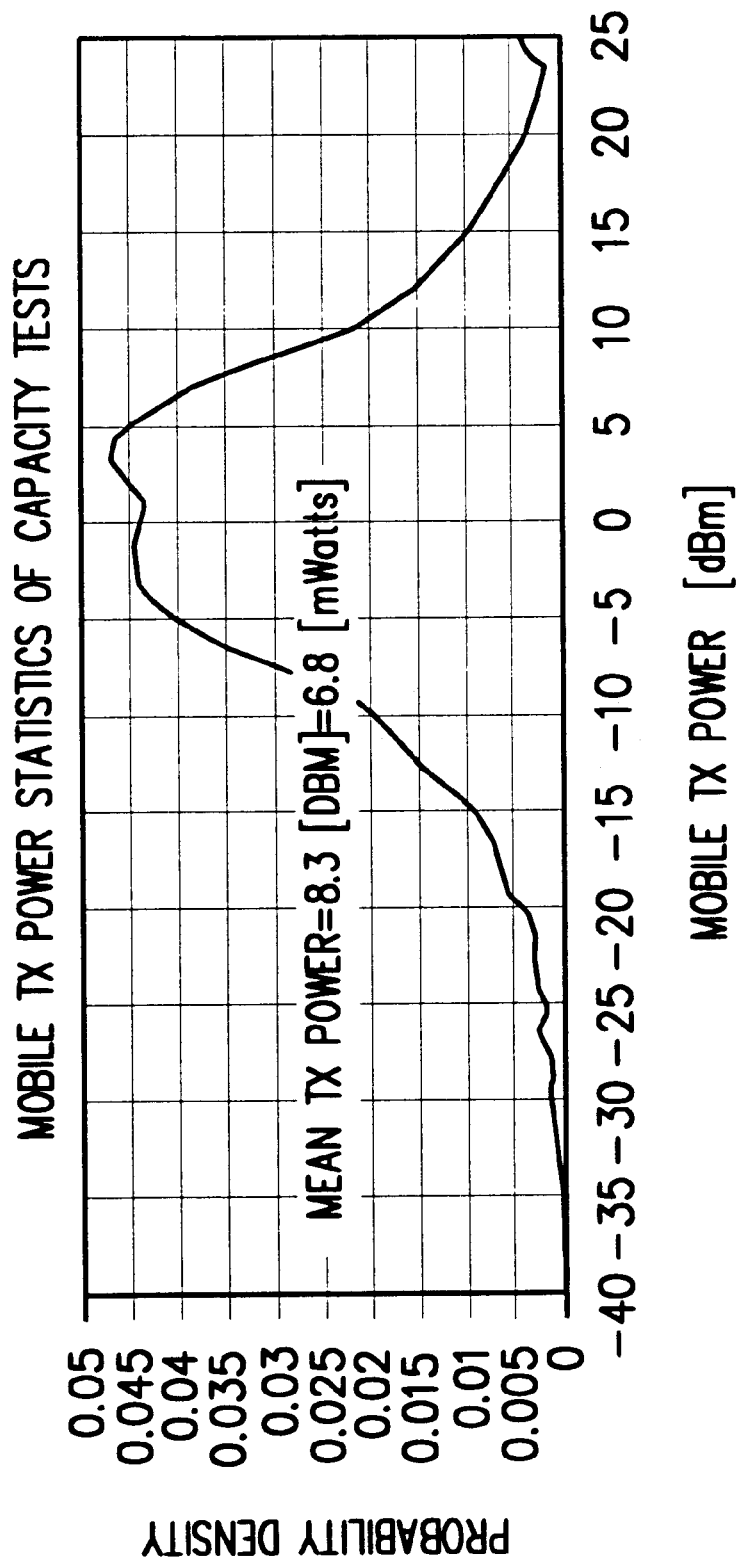
FIG. 5 is a diagram illustrating a characteristic curve of the power amplifier.

FIG. 5 illustrates an output characteristic curve of a radio communication terminal. Specifically, the characteristic curve shows the field test results for the strength of the transmission signal in terms of a probability density and the transmission power.

Referring to FIGS. 3 and 5, on the assumption that the driver amplifier 101 has a 20 dB gain and a maximum output power of 20 dBm and the final amplifier 103 has a gain of over 8 dB and a maximum output power of 28 dBm, it is permissible to turn off (or disable) the final amplifier 103 when the transmission power is up to 17 dBm (FIG. 5). Specifically, the controller 106 generates the switching control signal of the first state to operate the first and second switches 102 and 104 in a bypass mode, when the transmission power is determined to be less than or equal to 17 dBm (FIG. 5). The power supply 107 then blocks the supply voltage V2 to the final amplifier 103, in response to the switching control signal of the first state. In this case, since the current does not flows into the final amplifier 103, it is possible to reduce the current consumption. On the contrary, when the transmission power is over 17 dBm, the controller 106 generates the switching control signal of the second state to operate the first and second switches 102 and 104 in a power-up mode. In this case, the final amplifier 103 is powered-up to operate normally.

Referring to FIGS. 4 and 5, on the assumption that the first driver amplifier 201 and the final amplifier 203 both have a gain of 28 dB and a maximum output power +28 dBm, and the second driver amplifier 208 has a gain of 13 dB and a maximum output power of +13 dBm, it is permissible to turn off the first driver amplifier 201 and the final amplifier 203 when the transmission power is less than or equal to 13 dBm (FIG. 5). Specifically, the controller 106 turns on the second driver amplifier 208 and switches the first and second switches 209 and 210 to the second driver amplifier 208. As a result, the input RF signal $R_I$ is primarily amplified at the second driver amplifier 208 and then output as the RF signal $RF_O$ through the second switch 210. To this end, the controller 106 generates the switching control signal of the first state to the extent the transmission power reaches 13 dBm (FIG. 5). The power supply 107 blocks the supply voltage V2 to the second driver amplifier 208 and provides the supply voltage V1 to the first power amplifier 300, in response to the switching control signal of the first state. In this manner, it is possible to save the current as much as that consumed in the final amplifier 203. On the contrary, when the transmission power is over 13 dBm, the controller 106 generates the switching control signal of the second state to switch the first and second switches 209 and 210 to the first power amplifier 300. In this case, the first driver amplifier 201 and the final amplifier 203 are powered-up to operate normally.

Preferably, the RF power amplifier is designed to have hysteresis properties so as to prevent mis-operation in determining the switch control mode. That is, when the transmission power is low because the received signal has a high strength, the second driver amplifier 208 is used. In the meantime, if it is necessary to increase the transmission power to above 7 dBm, the second driver amplifier 208 is turned off and instead, the first power amplifier 300 is turned on to increase the transmission power. Further, when it is necessary to process or amplify a transmission power below 10 dBm to output the 13 dBm transmission power, the first power amplifier 300 is turned off and instead, the second power amplifier 208 is turned on.

Generally, in the downtown area, the radio communication terminal outputs a mean transmission power. Therefore, the RF power amplifier operates in the bypass mode where the final amplifier is turned off blocking the idle current flowing into the same, thereby reducing the overall current consumption and increasing the battery run-time.

As described above, the power saving device of the invention reduces the current consumption during a telephone conversation, and thus extends the battery run-time.

While the present invention has been described in detail with reference to the specific embodiment, it is a mere exemplary application. Thus, it is to be clearly understood that many variations can be made by anyone skilled in the art within the scope and spirit of the present invention.

What is claimed is:

1. A power saving device for a radio communication terminal including a multi-stage power amplifier and an RSSI (Received Signal Strength Indicator) detector, comprising:
    a controller for generating a switching control signal according to an RSSI value of a signal received from a base station, detected by the RSSI detector;
    an output path selector for selecting one of output signals from first and second amplifiers in response to the switching control signal;
    a signal path selector connected between the first and second amplifiers, for selectively connecting an output of the first amplifier to the second amplifier or to the output path selector, in response to the switching control signal; and
    a power supply for blocking a high supply voltage to the second amplifier when the output of the first amplifier is connected to the output path selector, in response to the switching control signal, wherein the first and second amplifiers are provided with different variable voltages, said voltages being independently variable from each other.

2. A power saving device for a radio communication terminal having a first amplifier for high power and a second amplifier for low power, comprising:
    a signal path selector for switching an input signal to an input node of the first or second amplifier in response to a switching control signal;
    an output path selector for selecting an output signal from the first and second amplifiers in response to the switching control signal;
    an RSSI detector for detecting the signal strength of a signal received from a base station;
    a controller for analyzing the detected signal strength, generating the switching control signal of a first state to enable the signal path selector to switch the input signal to the first amplifier and enable the output path selector to select the output signal of the first amplifier, and generating the switching control signal of a second state to enable the signal path selector to switch the input signal to the second amplifier and enable the output path selector to select the output signal of the second amplifier; and
    a power supply for blocking a first supply voltage to the first amplifier in response to the switching control signal of the second state, and blocking a second supply voltage to the second amplifier in response to the switching control signal of the first state, wherein the first and second amplifiers are provided with different variable voltages, said voltages being independently variable from each other.

3. The power saving device as claimed in claim 2, wherein the first amplifier has a gain higher than that of the second amplifier.

4. The power saving device as claimed in claim 3, wherein the signal path selector is a power splitter.

5. The power saving device as claimed in claim 2, wherein the signal path selector comprises a switch having a common node connected to the input signal, a first contact node connected to an input of the first amplifier and a second contact node connected to an input of the second amplifier.

6. The power saving device as claimed in claim 2, wherein the first and second amplifiers are provided with a level control signal.

7. The power saving device as claimed in claim 2, wherein the switching control signal of the first state is generated when the received signal strength is less than or equal to a predetermined level.

8. The power saving device as claimed in claim 2, wherein the switching control signal of the second state is generated when the received signal strength is higher than a predetermined level.

9. The power saving device as claimed in claim 7, wherein the predetermined level is 17 dBm.

10. The power saving device as claimed in claim 7, wherein the predetermined level is 13 dBm.

11. The power saving device as claimed in claim 8, wherein the predetermined level is 17 dBm.

12. A method for saving power in a radio communication terminal having a multi-stage power amplifier and an RSSI (Received Signal Strength Indicator) detector, comprising the steps of:

determining the signal strength of a received signal from a base station;

generating a switching control signal in response to the detected signal strength;

selecting an input path and an output path for the received signal in response to the generated switching control signal; and blocking other supply voltages except for a selected supply voltage to one of the stages of the multi-stage amplifier in response to the switching control signal, wherein each stage of the multi-stage amplifier is provided with different variable voltages, said voltages being independently variable from each other.

13. The method as claimed in claim 12, wherein said step of generating further comprises the steps of:

generating a switching control signal of a first state when the determined strength of the received signal is equal to or less than a predetermined value; and generating a switching control signal of a second state when the determined strength of the received signal is greater than the predetermined value.

14. The method as claimed in claim 13, wherein said predetermined value is 13 dBm.

15. The method as claimed in claim 13, wherein said predetermined value is 17 dBm.

* * * * *